United States Patent
Benndorf (10) Patent No.: US 8,374,445 B2
(45) Date of Patent: Feb. 12, 2013

(54) METHOD FOR THE COMPRESSION OF DATA USING A RUN-LENGTH CODING

(75) Inventor: Steffen Benndorf, Röthenbach (DE)

(73) Assignee: Siemens Aktiengesellschaft, München (DE)

( * ) Notice: Subject to any disclaimer, the term of this patent is extended or adjusted under 35 U.S.C. 154(b) by 955 days.

(21) Appl. No.: 12/150,213

(22) Filed: Apr. 24, 2008

(65) Prior Publication Data
US 2008/0267300 A1 Oct. 30, 2008

(30) Foreign Application Priority Data
Apr. 30, 2007 (DE) .................. 10 2007 020 292

(51) Int. Cl.
*G06K 9/36* (2006.01)
(52) U.S. Cl. ...................... 382/238; 382/232
(58) Field of Classification Search ........... 382/232–253
See application file for complete search history.

(56) References Cited

U.S. PATENT DOCUMENTS

| | | | | |
|---|---|---|---|---|
| 3,833,900 A * | 9/1974 | Bahl et al. | ............ | 341/65 |
| 4,454,546 A * | 6/1984 | Mori | ............ | 382/238 |
| 5,091,977 A * | 2/1992 | Katata et al. | ............ | 382/238 |
| 6,477,280 B1 * | 11/2002 | Malvar | ............ | 382/245 |
| 6,980,597 B1 * | 12/2005 | Ling | ............ | 375/240.19 |
| 7,095,808 B1 * | 8/2006 | Shohara | ............ | 375/340 |
| 2001/0036308 A1 * | 11/2001 | Katayama et al. | ............ | 382/166 |
| 2006/0115170 A1 * | 6/2006 | Brakus | ............ | 382/245 |

OTHER PUBLICATIONS

Nicholl et al IEE proceedings Visual image signal processing 1998 Feature Directed Spiral Coding of Magnetic Resonance Images.*
ISO/IEC International Standard 14495-1, "Information technology—Lossless and near-lossless compression of continous-tone still images: Baseline", First edition Dec. 1, 1999, JPEG-LS Part I, pp. 1-71.
ISO/IEC International Standard 15444-1, "Information technology—JPEG 2000 image coding system: Core coding system", Second edition Sep. 15, 2004, JPEG 2000 Part I, pp. 1-210.
ISO/IEC International Standard 10918-1, "Information technology—Digital compression and coding of continous-tone still images: Requirements and guidelines", First edition Feb. 15, 1994, pp. 1-4.
ISO/IEC International Standard 10918-2, "Information technology—Digital compression and coding of continous-tone still images: Compliance Testing", First edition Aug. 15, 1995, pp. 1-59.
National Electrical Manufacturers Association, "Digital Imaging and Communications in Medicine (DICOM), Part 5: Data Structures and Encoding", PS 3.5-2006 "Encapsulated RE compressed Images", 2006, pp. 1-108.
ISO/IEC International Standard 10918-1:1994 Technical Corrigendum 1, Information technology—Digital compression and coding of continous-tone still images: Part 1: Requirements and guidelines, Published Feb. 15, 2005.

* cited by examiner

*Primary Examiner* — Chan S Park
*Assistant Examiner* — Sean Motsinger (57) ABSTRACT

The invention relates to a method for the compression of data comprising values to be coded, in particular grey values or prediction errors using a run-length coding. A bit sequence of a bit plane which represents at least one item of partial information of at least one value to be coded is thereby coded coherently. This method is particularly used in connection with medical image data.

15 Claims, 4 Drawing Sheets

Spirally  Horizontal  Vertical

Structure of a coded bit plane:

| Partition size 2 bytes | Overall size of all partitions of the bit plane (4 bytes) | Complete coded bit plane | | | | | |
|---|---|---|---|---|---|---|---|
| | | Block code | n values | Block code | n values | Block code | n values |
| | | Partition | | Partition | | Partition | ... |

METHOD FOR THE COMPRESSION OF DATA USING A RUN-LENGTH CODING

CROSS REFERENCE TO RELATED APPLICATIONS

This application claims priority of German application No. 10 2007 020 292.1 filed Apr. 30, 2007, which is incorporated by reference herein in its entirety.

FIELD OF THE INVENTION

The invention relates to a method for the compression of data comprising values to be coded using a run-length coding.

The invention can be used particularly in connection with the compression of medical image data. The invention can also be used for the compression of data, for example audio, voice or video data.

BACKGROUND OF THE INVENTION

Currently, the following methods for a lossless compression of data, in particular image data, are known:
1. JPEG-LS (LS=Lossless) (e.g. published in ISO/IEC International Standard 14495-1 (JPEG-LS Part 1),
2. JPEG2000-Lossless (e.g. published in ISO/IEC International Standard 15444-1 (JPEG 2000 Part 1)),
3. Lossless-JPEG (e.g. published in ISO/IEC International Standard 10918-1 (JPEG Part 1), and ISO/IEC International Draft Standard 10918-2 (JPEG Part 2),
4. RLE (e.g. published in Digital Imaging and Communications in Medicine (DICOM), PS 3.5-2006, Annex G, "Encapsulated RLE compressed Images", published by: National Electrical Manufacturers Association).

The method RLE is also known as the so-called run length compression.

In table 1, a representation of (numerical) values to be coded with the data type byte (that is, 8 bit) is shown, for example. In the first row, arbitrary numerical values can be seen. These numerical values can also represent grey values of a medical image. The corresponding numerical value is represented with corresponding zeroes and ones from bit0 to bit7 in every column.

Conventional compression methods—represented in a simplified manner—run every column from bit0 to bit7 and code the corresponding numerical value of the first row, represented in bit0 to bit7, with a suitable code.

For example, the frequency of a numerical value in a row of numerical values could be determined. A Huffman coding could for example be used for this.

The known method is disadvantageous in that the code used for coding has to be disclosed to a decoder for decoding, whereby a so-called overhead forms with complicated codes.

SUMMARY OF THE INVENTION

The object of the invention now consists in optimizing a method for the compression of data using a run-length coding.

This object is achieved by the features of the independent claims. Advantageous developments of the invention are characterised in the dependent claims.

An essential aspect of the invention in connection with a method for the compression of data comprising values to be coded using a run-length coding consists in the fact that a bit sequence of a bit plane which represents at least one item of partial information of at least a value to be coded, are coded in a coherent manner. According to this, instead of coding every value individually—as is implemented in the prior art mentioned above—the individual bit planes of all values to be coded are coded coherently.

According to the table 1 mentioned above as an example, the values to be coded are represented in the first row of the table. A bit sequence of a bit plane, according to table 1, row of bit1, for example, is entirely or partially coded coherently according to the invention. Thereby, a bit of a bit plane (for example bit1 in table 1) represents at least one item of partial information (for example 1 bit of the value to be coded in column 1 of the above-mentioned table 1). In other words, when contemplating the example of table 1, the values to be coded are coded coherently horizontally per bit plane or per row according to the invention, instead of coding the values to be coded vertically or column by column according to the above-mentioned state of the art.

The invention entails the following advantages:
The method for the compression of data according to the invention only requires one pass (1 pass).
During the compression, similarities between the values to be coded are utilized. A compression gain thereby arises.
Additionally, the overhead can be avoided by the transfer of codes to the decoder.

A further aspect of the invention relates to a data unit for use in an electronic device, in particular a medical imaging device, whereby the data unit for at least one sequence of data is formed in such a manner that the at least one sequence of data can be compressed in accordance with the inventive method.

A further aspect of the invention relates to an imaging device comprising such a data unit. The invention addition-

TABLE 1

| Example for 20 numerical values, data type byte | | | | | | | | | | | | | | | | | | | | |
|---|---|---|---|---|---|---|---|---|---|---|---|---|---|---|---|---|---|---|---|---|
| | 5 | 23 | 7 | 0 | 18 | 67 | 200 | 17 | 45 | 12 | 5 | 7 | 78 | 14 | 72 | 71 | 12 | 18 | 31 | 6 |
| Bit0 | 1 | 1 | 1 | 0 | 0 | 1 | 0 | 1 | 1 | 0 | 1 | 1 | 0 | 0 | 0 | 0 | 0 | 0 | 1 | 0 |
| Bit1 | 0 | 1 | 1 | 0 | 1 | 1 | 0 | 0 | 0 | 0 | 0 | 1 | 1 | 0 | 0 | 0 | 1 | 1 | 1 | 1 |
| Bit2 | 1 | 1 | 1 | 0 | 0 | 0 | 0 | 0 | 1 | 1 | 1 | 1 | 1 | 1 | 0 | 0 | 0 | 0 | 1 | 1 |
| Bit3 | 0 | 0 | 0 | 0 | 0 | 0 | 1 | 0 | 1 | 1 | 0 | 0 | 1 | 1 | 0 | 1 | 1 | 0 | 1 | 0 |
| Bit4 | 0 | 1 | 0 | 0 | 1 | 0 | 0 | 1 | 0 | 0 | 0 | 0 | 0 | 0 | 0 | 0 | 0 | 1 | 1 | 0 |
| Bit5 | 0 | 0 | 0 | 0 | 0 | 0 | 0 | 0 | 1 | 0 | 0 | 0 | 0 | 0 | 0 | 0 | 0 | 0 | 1 | 0 |
| Bit6 | 0 | 0 | 0 | 0 | 0 | 1 | 1 | 0 | 0 | 0 | 0 | 0 | 1 | 0 | 0 | 1 | 0 | 0 | 0 | 0 |
| Bit7 | 0 | 0 | 0 | 0 | 0 | 0 | 1 | 0 | 0 | 0 | 0 | 0 | 0 | 0 | 0 | 0 | 0 | 0 | 0 | 0 | ally comprises a computer program product, in particular for operating such a data unit, comprising at least one module for implementing the method according to the invention. The invention further comprises a storage medium, in particular a DVD data carrier comprising such a computer program product.

A further aspect of the invention particularly consists in connection with medical images in a method for scanning a medical image, wherein scanned image information is represented in image data and possibly stored. The image data is coded using the method according to the invention for the compression of data, wherein the image information is scanned spirally from an image edge towards the image center.

It is sensible, in particular in connection with a run-length coding according to the invention, if the bit sequences to be coded comprise bit changes which are as few as possible. As many bits of the individual bit planes are equated with similar values to be coded (see table 1), it is advantageous to arrange the picture elements of an image in such a manner that the lowest value differences can be expected. So as to achieve a better homogeneity of the values to be coded, it is advantageous to avoid value jumps which occur during the transfer particularly between two image rows.

As the image information is often in the center of an image with medical images, according to the invention it is read in spirally from the edge of the image to the center. A grey value fluctuation which occurs between the edge and the center during the normal row by row reading-in is thereby avoided.

According to a further development of the invention, the value to be coded contains a grey value or a color value or a contrast value or a so-called prediction value. So as to reduce redundancies within the values to be coded, a predictor is used with which the next value is estimated. A prediction error is determined from the deviation between the predictor and the actual value to be coded. The above-mentioned prediction error can further be stored in a suitable storage region.

Similar or identical values to be coded will preferably be stored in the same storage region.

According to a further development of the invention, the data represent medical image data in particular in the form of the so-called DICOM standard.

Furthermore, a coding type is chosen for the run-length coding.

The following coding types can be chosen:

the coding is implemented in such a manner that a code value is written from bit change to bit change, the coding is implemented in such a manner that a code value is written from one 1-bit to the next 1-bit, the coding is implemented in such a manner that a code value is written from one 0-bit to the next 0-bit.

According to a further advantageous development of the invention, such codes are used for the further coding of the code values which can be coded with data types of variable length. Data types of variable length have the advantage of occupying existing storage regions in a variable manner.

The bit plane to be coded can preferably be divided into several partitions having the same length in an advantageous manner.

BRIEF DESCRIPTION OF THE DRAWINGS

The invention is explained in more detail in the following while referring to a drawing. The drawing thereby shows.

DETAILED DESCRIPTION OF THE INVENTION

Figure 1:
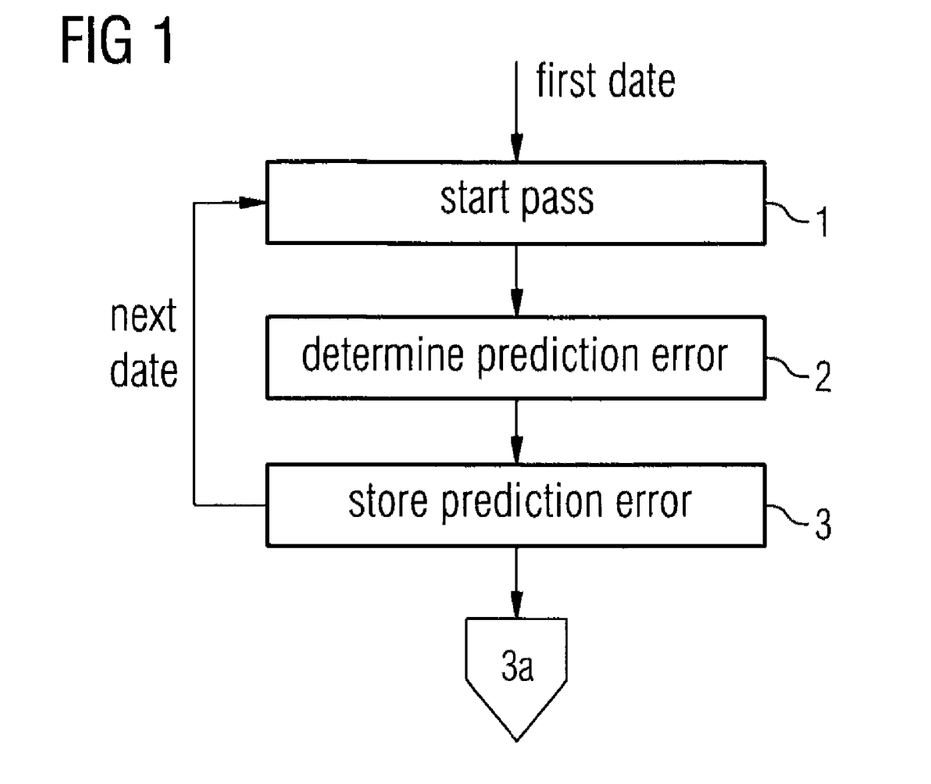
FIGS. 1 and 2 respectively a flow diagram for the schematic representation of the individual steps of the method according to the invention, FIG. 3 the read-in direction of the values to be coded, for example of a medical image, FIG. 4 an exemplary structure of a bit plane coded with the method according to the invention, and FIG. 5 schematically shows an electronic device, in particular a medical imaging device comprising a data unit.

According to FIG. 1, in step 1 the pass of the method according to the invention is started with the first date of the data to be compressed. In step 2, a prediction error is determined. Determination methods for such a prediction error are explained in more detail in the following. In step 3, the prediction error is stored in a suitable storage region. In the above-mentioned table 1, a prediction error with the value 5 is, for example, at the first position in the first row. These steps can be repeated until the storage region is filled with a certain number of values to be coded, in the example prediction errors.

Figure 2:
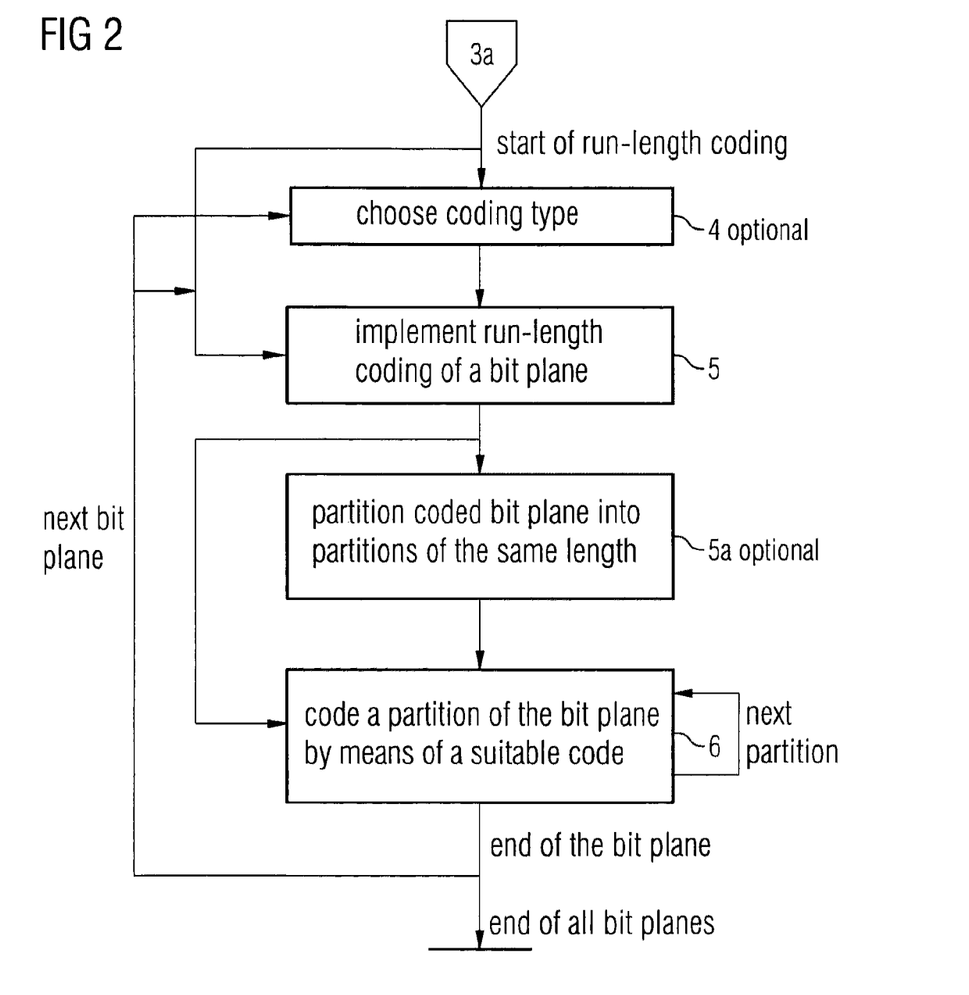

According to FIG. 2, the method from FIG. 1 is continued with step 3a. The run-length coding of the bit plane is started with the first bit plane. The coding type to be used is usually preset. In step 4, the coding type for the bit plane to be coded can optionally be changed or possibly chosen again. The run-length coding of the bit plane is carried out in step 5. The bit plane to be coded can optionally be partitioned into partitions of the same length in step 5a. In step 6, either a partition or the entire bit plane is coded by means of a suitable code. If a partition was coded, the next partition is coded afterwards. The method can correspondingly be repeated with the next bit plane to be coded.

In the following, the steps of the method according to the invention are described in more detail:

The run-length compression represents a possibility to store arbitrary data and to thereby compress it. In principle, the invention can be equated to an entropy coding, wherein the functioning principle is different to the entropy coding. The data is restructured with the run-length compression of the respective bit planes. Instead of coding every value to be coded, e.g. a grey value, individually, the individual bit planes of all values to be coded are coded coherently.

If a run-length coding of every individual bit plane is now implemented (see table 1: bit 0, bit 1 . . . ) (step: 3a), every bit plane receives a new value sequence. Different coding types are present with which the run-length coding can be implemented (step: 4):

run-length from bit change to bit change
→ called bitRLE type 1 in what follows, run-length from 1 to the next 1
→ called bitRLE type 2 in what follows, and run-length from 0 to the next 0
→ called bitRLE type 3 in what follows, With the first two coding types, every bit plane is started with a 1. With the last-mentioned coding type, every bit plane is started with a 0.

Implementing the bitRLE type 1

TABLE 2

Bit planes from table 1 coded in BitRLE type 1

Bit0 table 1: 1110 → 4, 01 → 2, 0 → 1, 1 → 1, 10 → 1, 1 → 1, 10 → 2, 000001 → 6, 0 → 1

| Bit0 | 4 | 2 | 1 | 1 | 2 | 1 | 2 | 6 | 1 |   |
|------|---|---|---|---|---|---|---|---|---|---|
| Bit1 | 1 | 1 | 2 | 1 | 2 | 5 | 2 | 3 | 4 |   |
| Bit2 | 4 | 5 | 6 | 4 | 1 |   |   |   |   |   |
| Bit3 | 1 | 6 | 1 | 1 | 2 | 2 | 2 | 1 | 2 | 1 | 1 |
| Bit4 | 1 | 1 | 1 | 2 | 1 | 2 | 1 | 9 | 2 |   |
| Bit5 | 1 | 8 | 1 | 9 | 1 |   |   |   |   |   |
| Bit6 | 1 | 5 | 2 | 5 | 1 | 2 | 4 |   |   |   |
| Bit7 | 1 | 6 | 1 | 12 |   |   |   |   |   |   |

Implementing the bitRLE type 2

TABLE 3

Bit planes from table 1 coded in bitRLE type 2

Bit 0 table 1: 1 → 1, 1 → 1, 1 → 1, 001 → 3, 01 → 2, 1 → 1, 01 → 2, 1 → 1, 0000001 → 7, 01 → 2

| Bit0 | 1 | 1 | 1 | 3 | 2 | 1 | 2 | 1 | 7 | 2 |   |
|------|---|---|---|---|---|---|---|---|---|---|---|
| Bit1 | 2 | 1 | 2 | 1 | 6 | 1 | 4 | 1 | 1 | 1 |   |
| Bit2 | 1 | 1 | 1 | 6 | 1 | 1 | 1 | 1 | 1 | 5 | 1 |
| Bit3 | 7 | 2 | 1 | 3 | 1 | 2 | 1 | 2 | 2 |   |   |
| Bit4 | 2 | 3 | 3 | 10 | 1 | 2 |   |   |   |   |   |
| Bit5 | 9 | 10 | 2 |   |   |   |   |   |   |   |   |
| Bit6 | 6 | 1 | 6 | 3 | 5 |   |   |   |   |   |   |
| Bit7 | 7 | 14 |   |   |   |   |   |   |   |   |   |

The coding type bitRLE type 3 is carried out analogously to bitRLE type 2.

The result of the respective run-length coding of a bit plane will now be written by means of suitable codes (step 6).

So as to enable a storage space as small as possible and an unlimited value region, a coding independent of the data type (type-free coding) can be used.

For example, the following codes are available:

| Coded numerical value | BitRLE Code 1 | BitRLE Code 2 | BitRLE Code 3 | BitRLE Code 4 | BitRLE Code 5 | BitRLE Code 6 |
|---|---|---|---|---|---|---|
| 1  | 1                | 10        | 1         | 10      | 10      | 10 |
| 2  | 01               | 11        | 010       | 11      | 11      | 11 |
| 3  | 001              | 010       | 011       | 0100    | 010     | 01 |
| 4  | 0001             | 011       | 0010      | 0101    | 011     | 001 |
| 5  | 00001            | 0010      | 0011      | 0110    | 00100   | 0001 |
| 6  | 000001           | 0011      | 00010     | 0111    | 00101   | 00001 |
| 7  | 0000001          | 00010     | 00011     | 001000  | 00110   | 000001 |
| 8  | 00000001         | 00011     | 000010    | 001001  | 00111   | 0000001 |
| 9  | 000000001        | 000010    | 000011    | 001010  | 0001000 | 00000001 |
| 10 | 0000000001       | 000011    | 0000010   | 001011  | 0001001 | 000000001 |
| 11 | 00000000001      | 0000010   | 0000011   | 001100  | 0001010 | 0000000001 |
| 12 | 000000000001     | 0000011   | 00000010  | 001101  | 0001011 | 00000000001 |
| 13 | 0000000000001    | 00000010  | 00000011  | 001110  | 0001100 | 0000000000001 |
| 14 | 00000000000001   | 00000011  | 000000010 | 001111  | 0001101 | 000000000000001 |
| 15 | 000000000000001  | 000000010 | 000000011 | 00010000 | 0001110 | 0000000000000001 |

-continued

| Coded numerical value | BitRLE Code 1 | BitRLE Code 2 | BitRLE Code 3 | BitRLE Code 4 | BitRLE Code 5 | BitRLE Code 6 |
|---|---|---|---|---|---|---|
| 16 etc. | 0000000000000001 | 000000011 | 0000000010 | 00010001 | 0001111 | 0000000000000001 |

TABLE 4

Codes for the bitRLE coding

| Coded numerical value | BitRLE Code 7 | BitRLE Code 8 | BitRLE Code 9 | BitRLE Code 10 | BitRLE Code 11 |
|---|---|---|---|---|---|
| 1 | 01 | 1 | 1 | 1 | 01 |
| 2 | 10 | 01 | 01 | 01 | 10 |
| 3 | 11 | 001 | 0010 | 001 | 11 |
| 4 | 0001 | 0001 | 0011 | 00010 | 0010 |
| 5 | 0010 | 000010 | 00010 | 00011 | 0011 |
| 6 | 0011 | 000011 | 00011 | 0000100 | 000100 |
| 7 | 000001 | 00000100 | 000010 | 0000101 | 000101 |
| 8 | 000010 | 00000101 | 000011 | 0000110 | 000110 |
| 9 | 000011 | 00000110 | 0000010 | 0000111 | 000111 |
| 10 | 00000001 | 00000111 | 0000011 | 000001000 | 00001000 |
| 11 | 00000010 | 0000001000 | 00000010 | 000001001 | 00001001 |
| 12 | 00000011 | 0000001001 | 00000011 | 000001010 | 00001010 |
| 13 | 0000000001 | 0000001010 | 000000010 | 000001011 | 00001011 |
| 14 | 0000000010 | 0000001011 | 000000011 | 000001100 | 00001100 |
| 15 | 0000000011 | 0000001100 | 0000000010 | 000001101 | 00001101 |
| 16 etc. | 000000000001 | 0000001101 | 0000000011 | 000001110 | 00001110 |

Example for the coding of bit plane 5 from table 1:

```
Original bit string (bit 5)                  00000000100000000010
Values for bitRLE type 1 (step 5): 1.8    .1.9    .1
Coded bit string with BitRLE code 3:      1 000010 1 000011 1
Values for bitRLE type 2 (step 5): 9 .10    .2
Coded bit string with BitRLE code 4: 001010 001011 11
```

Result:

With the bitRLE type 1, the original bit string 5 can be coded with 15 bits instead of 20 bits. With bitRLE type 2, 14 bits are sufficient.

For the compression of e.g. a 16 bit grey scale image, 16 bit planes result for the grey values plus—as explained in the following—a prefix plane, which are all coded separately. So that the best data-type free coding can always be used, the complete bit plane is ideally not written with a certain code during coding. Rather, the best possible coding can be determined for a fixed number of values (e.g. 256), and then written as a bit stream.

Partioning of the value string (step 5a)

With very long value strings, an optimal compression is only achieved by disassembling the value string into fixed partitions. Every partition thereby contains the same number of values. The bitRLE code can be changed between the partitions. The bitRLE code is fixed within one partition.

The compression takes place by using the most favorable bitRLE code for a partition. For this, all values of a partition should be present and be analyzed.

The partition size can be fixed separately for each bit plane. The partition size has to be communicated to the decoder.

So that the decoding of a data block is definite, the first value of a new partition is the code of the bitRLE code used in the partition. This block code is always coded in bitRLE code 9. The following block codes are thereby valid for the different bitRLE codes:

TABLE 5

Block codes for the bitRLE coding of a partition

| | Numerical value of the block code | Block code in bitRLE code 9 |
|---|---|---|
| BitRLE Code 1 | 1 | 1 |
| BitRLE Code 2 | 2 | 01 |
| BitRLE Code 3 | 3 | 0010 |
| BitRLE Code 4 | 4 | 0011 |
| BitRLE Code 5 | 5 | 00010 |
| BitRLE Code 6 | 6 | 00011 |
| BitRLE Code 7 | 7 | 000010 |
| BitRLE Code 8 | 8 | 000011 |
| BitRLE Code 9 | 9 | 0000010 |
| BitRLE Code 10 | 10 | 0000011 |
| BitRLE Code 11 | 11 | 00000010 |

Figure 4:
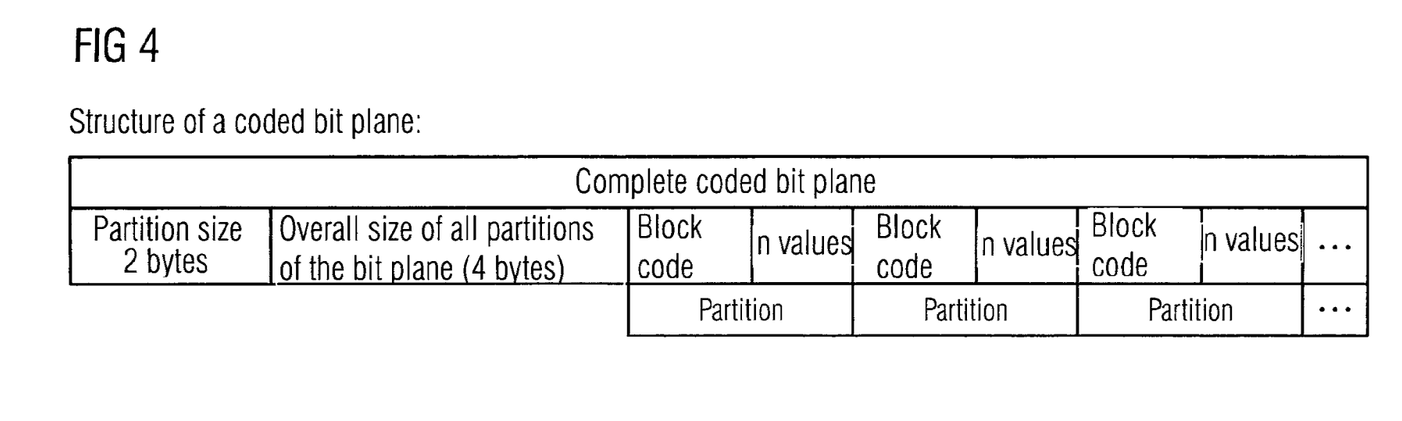

In FIG. 4, a structure of a bit plane coded with bitRLE is shown in an exemplary manner.

Possible applications for the bit planes run-length compression

The run-length compression on the bit plane is suitable for a compression of data streams whose content and structure can be unknown. The better the compression is adapted to a specific application case (compression of images → compression of medical images, compression of audio files → compression of voice files etc.), the better the compression.

The use of run-length compression on the bit plane is further shown with two examples.

Compression of medical images in DICOM 3 format

This compression is suitable for the compression of complete DICOM files. For this, the pixel data is not compressed separately, rather the complete file including overlays, waveforms and all present DICOM attributes are compressed as data stream. So as to achieve a good compression result, the bit depth (bits allocated) of the present pixel data is required. The format of the pixel matrix (rows, columns) is not required.

Every bit plane is separately coded with bitRLE type 2. In addition, a bit plane with bitRLE type 1 is required which is designated as prefix plane.

The data stream is passed from the first value to the last value. The prediction error E is always coded which is calculated from the absolute amount of the difference from the current value and its predecessor in the data stream (step 2).

$$E=|\text{value}(n-1)-\text{value}(n)|$$

n=current position in the data stream, value (n0−1)=0.

The prediction error E is now coded bitRLE type 2.

Additionally, a further bit is set according to the following rules in the prefix plane:

A 1 is set when
   value (n−1)<value (n) AND E<=value (n−1)
A 0 is set when
   value (n−1)>value (n) AND
   (E+value (n−1))<2^bitsAllocated With all other constellations, no prefix bit is necessary for the decoding. For this reason, it is not set in the prefix plane.

Table 6 shows the results of the bitRLE coding compared to other compression methods at six different DICOM data sets.

DICOM JPEG LOSSLESS and DICOM LS-JPEG are not suitable for compressing a complete data stream. Both methods only compress the pixel data.

BitRLE, rar and zip compress the complete data stream including all DICOM attributes.

| Normal region BitRLE type 2 | Extended region BitRLE type 2 | Prefix plane BitRLE type 1 |
|---|---|---|
| Bit plane 0 | Bit plane 0 | |
| Bit plane 1 | Bit plane 1 | |
| Bit plane 2 | Bit plane 2 | |
| Bit plane 3 | Bit plane 3 | |
| ... | ... | |
| Bit plane 15 | Bit plane 15 | |

Read-in direction of the grey values

Medical images normally comprise very large matrices, so that every bit plane consists of very many bits. For an image with a 512 matrix there results a bit sequence of 262144 individual bits for every bit plane.

Bit strings can then be reasonably compressed with a run-length coding, if the bit sequence contains bit changes which are as few as possible. As many bits of the individual bit planes are set the same with similar image values, mainly grey values, it is advantageous to arrange the image points of an image in such a manner that the lowest value differences can be expected.

If the grey values of an image are always read in row by row from right to left, different grey values are obtained during the transition from one image row to the next.

So as to achieve a better homogeneity of the values to be coded, particularly the grey values of the image, grey value jumps which occur during the transition between two image rows are to be avoided.

This can be achieved if in each case a row is read in from the right, and the next row is read in from the left. The transition between the individual image rows is conducted at two pic-

TABLE 6

Comparison of different compression methods with DICOM 3 images

| | MG1/12 Bit | MR2/12 Bit | NM1/12 Bit | RG1/15 Bit | RG3/10 Bit | XA1/12 Bit |
|---|---|---|---|---|---|---|
| DICOM Image uncompressed | 27,913 KB | 2,050 KB | 515 KB | 7,032 KB | 6,052 KB | 2,182 KB |
| DICOM JPEG LOSSLESS | 12,552 KB | 762 KB | 117 KB | 4,341 KB | 1,367 KB | 977 KB |
| DICOM LS-JPEG | 11,739 KB | 582 KB | 82 KB | 4,097 KB | 828 KB | 888 KB |
| rar | 13,858 KB | 713 KB | 109 KB | 4,420 KB | 1,407 KB | 1,002 KB |
| zip | 19,050 KB | 920 KB | 126 KB | 6,242 KB | 2,090 KB | 1,113 KB |
| BitRLE | 12,305 KB | 657 KB | 92 KB | 4,310 KB | 1,029 KB | 838 KB |

Compression of medical images (only the pixel matrix)

An improvement of the compression result compared to the compression of DICOM 3 images can be achieved when the pixel matrix is compressed separately from the other DICOM attributes. The rows, columns and the bit depth (bitsallocated) of the pixel matrix known are required for the compression.

Two separate storage regions, normal and extended, of bit planes (bitRLE type 2) and a prefix bit plane (bitRLE type 1) are required for the coding. Every storage region consists of bitsallocated bit planes.

The following example shows the arrangement of the required bit planes for bits allocated=16:

ture elements which are next to each other and which are therefore more similar to each other.

Even though the transition between the individual image rows is now very homogeneous, this form of reading-in has its weak points. The image information of a medical image often lies in the center of the image. This image information is generated by details and contrast in the normal case, which leads to distinctly different grey values compared to the edges of an image. The reading in of row by row always starts from the edge with every row (little information) via the center (plenty of information) again to the edge (little information). The grey values read out thus always follow a periodic oscillation from low grey values at the edge to high grey values in the center. This grey value fluctuation between the edge and the center can be avoided by reading in the grey values like a spiral.

Figure 3:
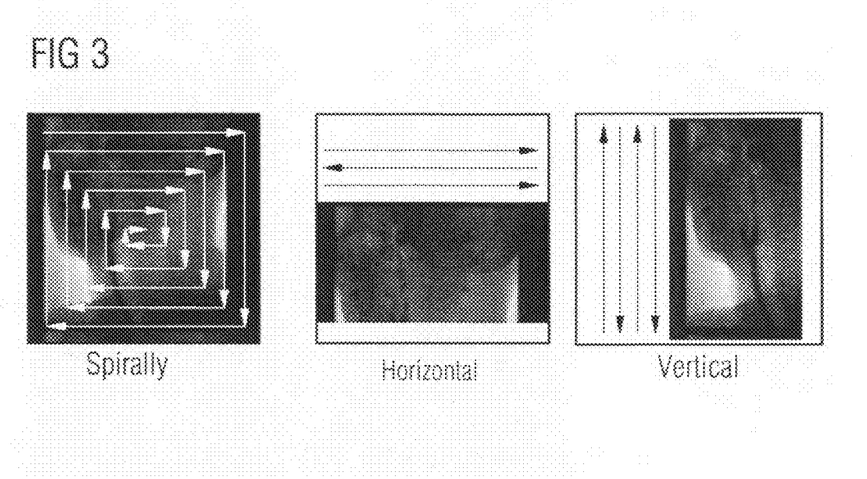

An oscillation of the grey values is avoided by this reading in. The grey value level only increases slowly. The grey values of similar image regions (especially at the edges) can be viewed coherently.

In FIG. 4, different reading-in directions are shown: spiral, horizontal and vertical reading-in.

Depending on the status of the image information, the most favorable reading-in information can be chosen.

Prediction and determination of the prediction error (step 2)

So as to reduce redundancies within the grey values to be coded, a simple predictor is used with which the grey value is estimated. The predictor always calculates the mean value M from the Western (w) and Northern (n) neighbors of the pixel x to be estimated.

→ Read-in direction of the pixel data $M=(n+w)/2$

The prediction error E is always coded, wherein:

$E=|M-X|$

Classification of the Prediction Error

The prediction error E to be coded is assigned to one of the two bit plane storage regions—normal or extended. The assignation takes place according to the rule When (w==n==nw), E is coded in the extended region, otherwise E is coded in the normal region.

The coding of E takes place in both storage regions with bitRLE type 2.

Coding of the prefix
In the prefix plane
a 1 is set when
   M<X AND E<=M
a 0 is set when
   M>X AND (E+M)<2^bitsAllocated
With all other constellations, no prefix bit is necessary for the decoding. For this reason, it is not set in the prefix plane.

Table 7 shows the results of the bitRLE coding compared to other DICOM compressions at six different DICOM data sets.

TABLE 7

Comparison of different compression methods with medical pixel data

|  | MG1/12 Bit 4664 * 3064 | MR2/12 Bit 1024 * 1024 | NM1/12 Bit 512 * 512 | RG1/15 Bit 1955 * 1841 | RG3/10 Bit 1760 * 1760 | MR3/12 Bit 512 * 512 |
|---|---|---|---|---|---|---|
| Pixel matrix uncompressed | 27,912 KB | 2,048 KB | 512 KB | 7,030 KB | 6,050 KB | 512 KB |
| JPEG LOSSLESS | 12,550 KB | 760 KB | 115 KB | 4,339 KB | 1,365 KB | 167 KB |
| LS-JPEG | 11,737 KB | 580 KB | 80 KB | 4,095 KB | 826 KB | 123 KB |
| JPEG2000 LOSSLESS | 11,947 KB | 573 KB | 87 KB | 4,182 KB | 810 KB | 117 KB |
| BitRLE | 11,883 KB | 593 KB | 84 KB | 4,134 KB | 891 KB | 120 KB |

Figure 5:
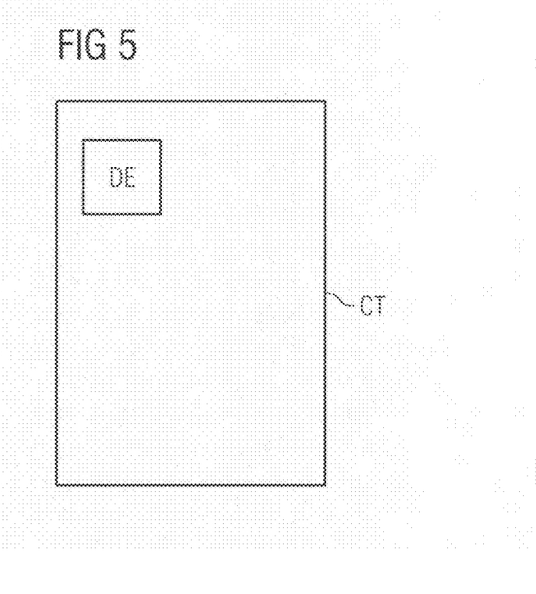

In FIG. 5, an electronic device is shown schematically, in particular a medical imaging device CT, for example a computer tomograph or a magnetic resonance device which comprises a data unit DE. This data unit is formed for a compression of at least one sequence of data according to the method described above. This data unit can further be operated with a computer program product comprising at least one module or a piece of software for implementing the method described above. This computer program product can preferably be stored for installation purposes on a storage medium, in particular a DVD data carrier.

The invention claimed is:

1. A method for compressing data, comprising:
coding a value of the data using a run-length coding; and
compressing the data by coherently coding a bit sequence of a bit plane representing an item of partial information of the value,
wherein the value to be coded is selected from the group consisting of: a grey value, a color value, and a contrast value,
wherein the value to be coded is estimated using a predictor,
wherein a prediction error is determined from a deviation between the estimate of the predictor and the value to be coded,
wherein a prefix plane is designated based on the prediction error,
wherein the prediction error is stored in a storage region,
wherein the storage region comprises two separate storage regions, a normal storage region and an extended storage region, and
wherein the prediction error is coded in one of the normal storage region and the extended storage region or in both of the normal storage region and the extended storage region based on a rule.

2. The method as claimed in claim 1, wherein the data comprises a plurality of values and similar or identical values are deposited in a same storage region.

3. The method as claimed in claim 1, wherein a coding type is chosen for the run-length coding.

4. The method as claimed in claim 3, wherein the coding type is from one bit change to another bit change.

5. The method as claimed in claim 3, wherein the coding type is from one 1-bit to the next 1-bit.

6. The method as claimed in claim 3, wherein the coding type is from one 0-bit to the next 0-bit.

7. The method as claimed in claim 1, wherein the value is further coded with a data type of variable length.

8. The method as claimed in claim 1, wherein the bit plane is divided into several partitions having preferably a same length.

9. The method as claimed in claim 1, wherein the data comprises a medical image data.

10. The method as claimed in claim 9, wherein the medical image data has a standard of Digital Imaging and Communications in Medicine.

11. The method as claimed in claim 9, wherein the medical image data is generated by spirally scanning a medical image from an edge of the image towards a center of the image.

12. An imaging device, comprising:
- an image device that records a medical image of a patient; and
- a data unit that compresses an image data of the medical image by coherently coding a bit sequence of a bit plane representing an item of partial information of a value of the image data using a nm-length coding,
- wherein the value to be coded is selected from the group consisting of a grey value, a color value, and a contrast value,
- wherein, the value to be coded is estimated using a predictor,
- wherein a prediction error is determined from a deviation between the estimate of the predictor and the value to be coded,
- wherein a prefix plane is designated based on the prediction error,
- wherein the prediction error is stored in a storage region,
- wherein the storage region comprises two separate storage regions, a normal storage region and an extended storage region, and
- wherein the prediction error is coded in one of the normal storage region and the extended storage region or in both of the normal storage region and the extended storage region based on a rule.

13. A non transitory computer readable medium storing a computer program product executable on a computer for compressing data, comprising:
- a computer code that compresses the data by coherently coding a bit sequence of a bit plane representing an item of partial information of a value of the data using a nm-length coding,
- wherein the value to be coded is selected from the group consisting of: a grey value, a color value, and a contrast value,
- wherein the value to be coded is estimated using a predictor,
- wherein a prediction error is determined from a deviation between the estimate of the predictor and the value to be coded,
- wherein a prefix plane is designated based on the prediction error,
- wherein the prediction error is stored in a storage region,
- wherein the storage region comprises two separate storage regions, a normal storage region and an extended storage region, and
- wherein the prediction error is coded in one of the normal storage region and the extended storage region or in both of the normal storage region and the extended storage region based on a rule.

14. The method as claimed in claim 5, wherein the prediction error is coded with the coding type from one 1-bit to the next 1-bit.

15. The method as claimed in claim 1,
- wherein the prediction error is coded in the extended storage region when w==n=nw, otherwise the prediction error is coded in the normal storage region,
- wherein the prediction error is coded in both of the normal storage region and the extended storage region when the run-length coding is from 1 to next 1, and
- wherein:
  - w is a mean value of a western neighbor of the data,
  - n is a mean value of a northern neighbor of the data, and
  - nw is a mean value of a northern-western neighbor of the data.

* * * * *

UNITED STATES PATENT AND TRADEMARK OFFICE
CERTIFICATE OF CORRECTION

PATENT NO. : 8,374,445 B2
APPLICATION NO. : 12/150213
DATED : February 12, 2013
INVENTOR(S) : Steffen Benndorf It is certified that error appears in the above-identified patent and that said Letters Patent is hereby corrected as shown below:

In the Claims:

Col. 13, Replace term "nm-length coding" in claim 12 line 7 with term "run-length coding";
Col. 13, Replace term "nm-length coding" in claim 13 line 7 with term "run-length coding";
Col. 14, Replace term "w==n=nw" in claim 15 line 3 with term "w==n==nw".

Signed and Sealed this
Sixteenth Day of July, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,374,445 B2  Page 1 of 1
APPLICATION NO. : 12/150213
DATED : February 12, 2013
INVENTOR(S) : Steffen Benndorf It is certified that error appears in the above-identified patent and that said Letters Patent is hereby corrected as shown below:

In the Claims:

Col. 13, line 10 Replace term "nm-length coding" in claim 12 line 7 with term "run-length coding";
Col. 13, line 35 Replace term "nm-length coding" in claim 13 line 7 with term "run-length coding";
Col. 14, line 24 Replace term "w==n=nw" in claim 15 line 3 with term "w==n==nw".

This certificate supersedes the Certificate of Correction issued July 16, 2013.

Signed and Sealed this
Thirteenth Day of August, 2013

Teresa Stanek Rea
*Acting Director of the United States Patent and Trademark Office*